(12) United States Patent
Makabe et al.

(10) Patent No.: US 11,935,744 B2
(45) Date of Patent: Mar. 19, 2024

(54) METHOD FOR MANUFACTURING NITRIDE SEMICONDUCTOR DEVICE

(71) Applicant: SUMITOMO ELECTRIC INDUSTRIES, LTD., Osaka (JP)

(72) Inventors: Isao Makabe, Osaka (JP); Ken Nakata, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 315 days.

(21) Appl. No.: 17/291,575

(22) PCT Filed: Dec. 16, 2019

(86) PCT No.: PCT/JP2019/049246
§ 371 (c)(1),
(2) Date: May 5, 2021

(87) PCT Pub. No.: WO2020/137667
PCT Pub. Date: Jul. 2, 2020

(65) Prior Publication Data
US 2021/0398801 A1 Dec. 23, 2021

(30) Foreign Application Priority Data

Dec. 27, 2018 (JP) ................. 2018-245213

(51) Int. Cl.
*H01L 21/02* (2006.01)
*C23C 16/30* (2006.01)
(Continued)

(52) U.S. Cl.
CPC ........ *H01L 21/0262* (2013.01); *C23C 16/303* (2013.01); *C23C 16/455* (2013.01); *C30B 25/14* (2013.01); *C30B 25/183* (2013.01); *C30B 29/403* (2013.01); *C30B 29/406* (2013.01); *H01L 21/02378* (2013.01); *H01L 21/0254* (2013.01); *H01L 29/2003* (2013.01); *H01L 29/205* (2013.01); *H01L 29/66462* (2013.01); *H01L 29/7786* (2013.01)

(58) Field of Classification Search
CPC ............. H01L 21/0262; H01L 29/7786; H01L 29/66462; C30B 29/403; C30B 29/406; C30B 25/14
See application file for complete search history.

(56) References Cited

U.S. PATENT DOCUMENTS

2007/0148920 A1  6/2007  Kasai
2008/0017099 A1  1/2008  Onomura
(Continued)

FOREIGN PATENT DOCUMENTS

JP   2008-028270    2/2008
JP   2013-207019   10/2013
(Continued)

*Primary Examiner* — Walter H Swanson
*Assistant Examiner* — Jacob T Nelson
(74) *Attorney, Agent, or Firm* — SMITH, GAMBRELL & RUSSELL, LLP

(57) ABSTRACT

A method for manufacturing a nitride semiconductor device includes the steps of growing a GaN channel layer on an SiC substrate using a vertical MOCVD furnace set at a first temperature using $H_2$ as a carrier gas, and TMG and $NH_3$ as raw materials, holding the SiC substrate having the grown GaN channel layer in the MOCVD furnace set at a second temperature higher than the first temperature using $H_2$ as a carrier gas, the MOCVD furnace being supplied with $NH_3$, and growing an InAlN layer on the GaN channel layer using the MOCVD furnace set at a third temperature lower than the first temperature using $N_2$ as a carrier gas, and TMI, TMA, and $NH_3$ as raw materials.

16 Claims, 14 Drawing Sheets

(51) Int. Cl.

| | |
|---|---|
| *C23C 16/455* | (2006.01) |
| *C30B 25/14* | (2006.01) |
| *C30B 25/18* | (2006.01) |
| *C30B 29/40* | (2006.01) |
| *H01L 29/20* | (2006.01) |
| *H01L 29/205* | (2006.01) |
| *H01L 29/66* | (2006.01) |
| *H01L 29/778* | (2006.01) |

(56) References Cited

U.S. PATENT DOCUMENTS

| | | |
|---|---|---|
| 2010/0009526 A1 | 1/2010 | Kasai |
| 2011/0065265 A1 | 3/2011 | Kasai |
| 2013/0244406 A1 | 9/2013 | Kasai |
| 2014/0361308 A1 | 12/2014 | Yui |
| 2015/0279942 A1* | 10/2015 | Yui ................ H01L 21/02381 257/77 |
| 2018/0158926 A1* | 6/2018 | Nakata ................ C30B 29/406 |
| 2018/0166271 A1 | 6/2018 | Era |

FOREIGN PATENT DOCUMENTS

| | | |
|---|---|---|
| JP | 2014-055103 | 3/2014 |
| JP | 2014-123767 | 7/2014 |
| JP | 2014-239159 | 12/2014 |
| JP | 2015-192026 | 11/2015 |
| JP | 2018-093076 | 6/2018 |
| JP | 2018-098356 | 6/2018 |
| JP | 2019140154 A * | 8/2019 |

\* cited by examiner

METHOD FOR MANUFACTURING NITRIDE SEMICONDUCTOR DEVICE

TECHNICAL FIELD

The present disclosure relates to a method for manufacturing a nitride semiconductor device.

CROSS-REFERENCE TO RELATED APPLICATIONS

This application claims priority to Japanese Patent Application No. 2018-245213 filed on Dec. 27, 2018, which is hereby incorporated in its entirety.

BACKGROUND ART

Nitride semiconductors such as gallium nitride (GaN) are formed by epitaxial growth on a semiconductor substrate. Such nitride semiconductors are formed by, for example, a metal organic chemical vapor deposition method (MOCVD method). The following Patent Literatures 1 and 2 disclose a crystal growth method using a so-called lateral flow method. The following Patent Literature 1 discloses a configuration of a crystal growth apparatus for suppressing thermal decomposition and intermediate reaction of raw materials on the upstream side of a substrate. The following Patent Literature 2 discloses that crystal growth is performed after deposit on the inner wall of a reaction chamber is removed by HCl.

CITATION LIST

Patent Literature

Patent Literature 1: Japanese Unexamined Patent Publication No. 2008-28270
Patent Literature 2: Japanese Unexamined Patent Publication No. 2014-55103

SUMMARY OF INVENTION

A method for manufacturing a nitride semiconductor device according to one aspect of the present disclosure includes the steps of growing a GaN channel layer on an SiC substrate using a vertical MOCVD furnace set at a first temperature using $H_2$ as a carrier gas, and TMG (trimethylgallium) and $NH_3$ as raw materials, holding the SiC substrate having the grown GaN channel layer in the MOCVD furnace set at a second temperature higher than the first temperature using $H_2$ as a carrier gas, the MOCVD furnace being supplied with $NH_3$, and growing an InAlN layer on the GaN channel layer using the MOCVD furnace set at a third temperature lower than the first temperature using $N_2$ as a carrier gas, and TMI (trimethylindium), TMA (trimethylaluminum), and $NH_3$ as raw materials.

DESCRIPTION OF EMBODIMENTS

Problems to be Solved by Disclosure

Figure 1:
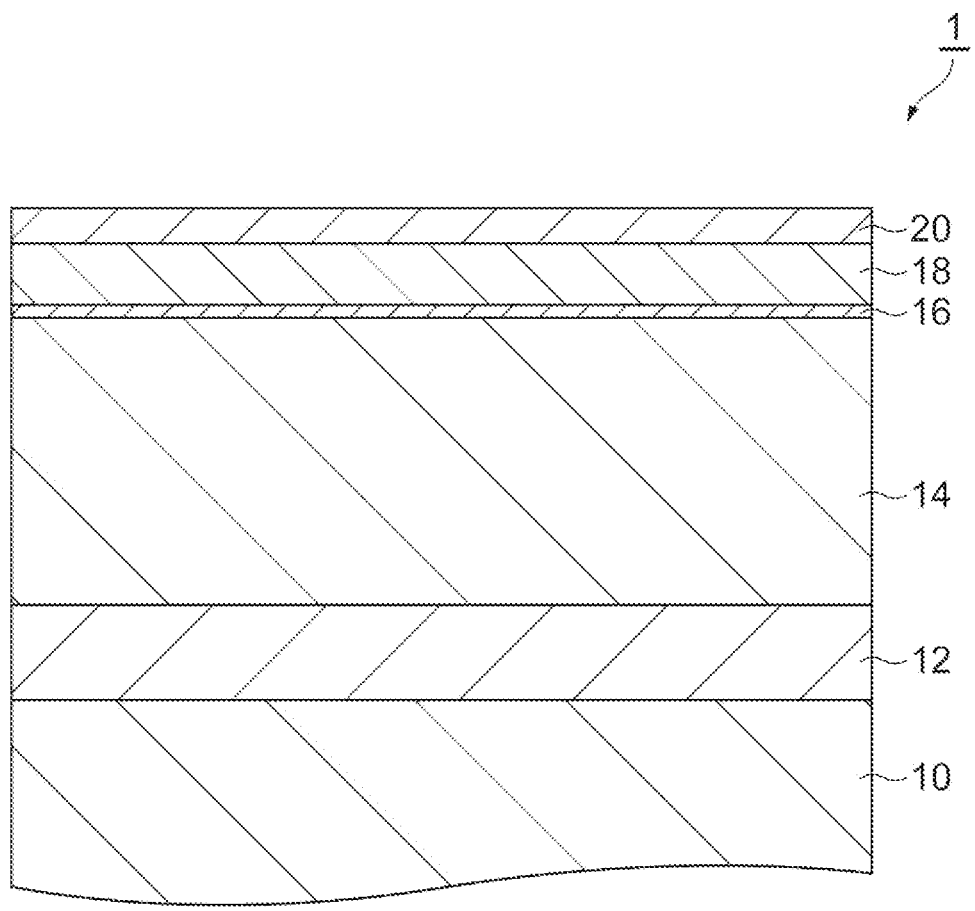
FIG. 1 is a cross-sectional view showing a semiconductor substrate used for a nitride semiconductor device according to the first embodiment.

In high electron mobility transistors (HEMTs) using a GaN layer grown by the MOCVD method as the channel layer, further improvement in high frequency characteristics is required. Examples of methods for improving the high frequency characteristics of HEMTs include thinning the barrier layer and increasing the concentration of the two-dimensional electron gas (2DEG). When a barrier layer formed of AlGaN crystal is thinned, reduction of the sheet carrier density in the barrier layer tends to be enhanced. In order to secure the sheet carrier density in the barrier layer, increasing the strain of the barrier layer with respect to the channel layer may be included. One example of means for increasing the strain includes increasing the Al composition in the AlGaN barrier layer. Theoretically, in an AlGaN crystal, it is possible to form a mixed crystal from GaN to AlN, the composition at either end, without phase separation. However, in reality, an AlGaN crystal having an Al composition of 0.3 or more cannot grow on the GaN layer. Accordingly, there is a limit in adjusting the sheet carrier density in the AlGaN barrier layer using the strain.

From the viewpoint of reducing the resistance of the barrier layer, attention has been paid to inclusion of indium (In) in the barrier layer. For example, InAlN having an In composition of 0.17 (that is, $In_{0.17}Al_{0.83}N$) is lattice-matched with GaN. When this InAlN crystal is used as the barrier layer, in the two-dimensional electron gas, the charge caused by spontaneous polarization becomes more dominant than the piezoelectric charge. Accordingly, high electron density is obtained even when the InAlN barrier layer is thinned. InAlGaN can be classified as an AlGaN-based compound or an InAlN-based compound, but hereinafter, it will be referred to as an InAlN-based compound.

When the sheet carrier densities in the $In_{0.17}Al_{0.83}N$ barrier layer is the same as that in the $Al_{0.3}Ga_{0.7}N$ barrier layer, the thickness of the former barrier layer may be set to half the thickness of the latter barrier layer or less. For example, when the sheet carrier density required for the barrier layer is $1.4 \times 10^{13}$ $cm^{-2}$, the thickness of the $Al_{0.3}Ga_{0.7}N$ barrier layer needs to be set to about 18 nm. On the other hand, when the barrier layer is an $In_{0.17}Al_{0.83}N$ barrier layer, the above sheet carrier density can be obtained having a thickness of 4 nm. In addition, there is a tendency that the thinner the barrier layer, the higher the amplification characteristics of HEMTs become. In view of these matters, the InAlN barrier layer is useful.

However, when growing an InAlN crystal on the GaN layer, a large amount of Ga tends to be mixed in the InAlN crystal. In this case, the lattice constant of the barrier layer does not reach the intended value, so that the amount of strain inherent in the film increases. In view of such problems, an object of the present disclosure is to provide a method for manufacturing a nitride semiconductor device allowing for growth of a high-quality barrier layer including an InAlN-based compound.

Effect of Present Disclosure

According to the present disclosure, it is possible to provide a method for manufacturing a nitride semiconductor device allowing for growth of a high-quality barrier layer including an InAlN-based compound.

DESCRIPTION OF EMBODIMENTS OF PRESENT DISCLOSURE

First, the contents of the embodiments of the present disclosure will be listed and described. One embodiment of the present disclosure is a method for manufacturing a nitride semiconductor device, including the steps of growing a GaN channel layer on an SiC substrate using a vertical MOCVD furnace set at a first temperature using $H_2$ as a carrier gas, and TMG (trimethylgallium) and $NH_3$ as raw materials, holding the SiC substrate having the grown GaN channel layer in the MOCVD furnace set at a second temperature higher than the first temperature using $H_2$ as a carrier gas, the MOCVD furnace being supplied with $NH_3$, and growing an InAlN layer on the GaN channel layer using the MOCVD furnace set at a third temperature lower than the first temperature using $N_2$ as a carrier gas, and TMI (trimethylindium), TMA (trimethylaluminum), and $NH_3$ as raw materials.

In this manufacturing method, the step is conducted of holding the SiC substrate having the grown GaN channel layer in the MOCVD furnace set at a second temperature higher than the first temperature using $H_2$ as a carrier gas, the MOCVD furnace being supplied with $NH_3$. This makes it possible to satisfactorily remove a deposit including Ga in the MOCVD furnace before the growth of the InAlN layer. Accordingly, the composition of Ga in the InAlN layer can be reduced more than before. In other words, the composition of In in the InAlN layer can be made higher than before. Thus, the composition ratio of each atom in the InAlN layer can be stabilized, so that a high-quality barrier layer including an InAlN-based compound can grow.

In the step of holding the SiC substrate, $H_2$, $NH_3$, and TMI may be supplied into the MOCVD furnace. In this case, in the step of holding the SiC substrate, a deposit including Ga in the MOCVD furnace can be more satisfactorily removed.

The second temperature may be higher than the first temperature by 20° C. or higher. In this case, in the step of holding the SiC substrate, a deposit including Ga in the MOCVD furnace can be more satisfactorily removed.

The manufacturing method may further include the step of growing an AlN layer on the GaN channel layer after the step of holding the SiC substrate and before the step of growing the InAlN layer, using the MOCVD furnace set at a fourth temperature lower than the first temperature using $H_2$ or $N_2$ as a carrier gas, and TMA and $NH_3$ as raw materials. In this case, it is possible to suppress the decrease in carrier density in the InAlN layer.

With respect to the third temperature and the second temperature, when the fourth temperature is closer to the third temperature, the carrier gas may be $N_2$, whereas when the fourth temperature is closer to the second temperature, the carrier gas may be $H_2$.

The MOCVD furnace has a support portion for supporting the SiC substrate, and a raw material supply portion facing the support portion in the thickness direction of the SiC substrate. In the step of holding the SiC substrate, the space between the SiC substrate and the raw material supply portion may be set to a first space, and in the step of growing the InAlN layer, the space between the SiC substrate and the raw material supply portion may be set to a second space wider than the first space. In addition, the first space may be 6 mm or less, and the second space may be 15 mm or more. In these cases, in the step of growing the InAlN layer, it becomes difficult for Ga included in the deposit to reach the InAlN layer. Thus, a higher quality barrier layer including an InAlN-based compound can grow.

The MOCVD furnace has a raw material supply portion, in which the temperature of the raw material supply portion may be set to a first apparatus temperature in the step of holding the SiC substrate, and the temperature of the raw material supply portion may be set to a second apparatus temperature lower than the first apparatus temperature in the step of growing the InAlN layer. In addition, the first apparatus temperature may be 60° C. or higher, and the second apparatus temperature may be 30° C. or lower. In these cases, a deposit including Ga is satisfactorily removed in the step of holding the SiC substrate.

Another embodiment of the present disclosure is a method for manufacturing a nitride semiconductor device, including the steps of growing a GaN channel layer on an SiC substrate using a vertical MOCVD furnace set at a first temperature using $H_2$ as a carrier gas, and TMG (trimethylgallium) and $NH_3$ as raw materials, holding the SiC substrate having the grown GaN channel layer at a second temperature of 1000° C. or higher and the first temperature or lower in the MOCVD furnace using $H_2$ as a carrier gas, the MOCVD furnace being supplied with $NH_3$ and TMI (trimethylindium) instead of TMG, and growing an InAlN layer on the GaN channel layer using the MOCVD furnace set at a third temperature lower than the second temperature using $N_2$ as a carrier gas, and TMI, TMA (trimethylaluminum), and $NH_3$ as raw materials.

In this manufacturing method, the step is conducted of holding the SiC substrate having the grown GaN channel layer in the MOCVD furnace set at high second temperature of 1000° C. or higher and the first temperature or lower using $H_2$ as a carrier gas, the MOCVD furnace being supplied with $NH_3$ and TMI. This replaces Ga included in the deposit in the MOCVD furnace with In before the growth of the InAlN layer. By sublimation of the replaced In, the deposit in the MOCVD furnace can be satisfactorily removed. Accordingly, the composition of Ga in the InAlN layer can be reduced more than before. In other words, the composition of In in the InAlN layer can be made higher than before. Thus, the composition ratio of each atom in the InAlN layer can be stabilized, so that a high-quality barrier layer including an InAlN-based compound can grow.

The manufacturing method may include a step of growing an AlN layer on the GaN channel layer at a fourth MOCVD furnace temperature lower than the second temperature and higher than the third temperature after the step of holding the SiC substrate and before the step of growing the InAlN layer using $H_2$ or $N_2$ as a carrier gas, and TMA and $NH_3$ as raw materials. In this case, it is possible to suppress the decrease in carrier density in the InAlN layer.

With respect to the first temperature and the third temperature, when the fourth temperature is closer to the first temperature, the carrier gas may be $N_2$, whereas when the fourth temperature is closer to the third temperature, the carrier gas may be $H_2$.

The MOCVD furnace has a support portion for supporting the SiC substrate, and a raw material supply portion facing the support portion in the thickness direction of the SiC substrate. In the step of holding the SiC substrate, the space between the SiC substrate and the raw material supply portion may be set to a first space, and in the step of growing the InAlN layer, the space between the SiC substrate and the raw material supply portion may be set to a second space wider than the first space. In addition, the first space may be 6 mm or less, and the second space may be 15 mm or more.

In these cases, in the step of growing the InAlN layer, it becomes difficult for Ga included in the deposit to reach the InAlN layer. Thus, a higher quality barrier layer including an InAlN-based compound can grow.

The MOCVD furnace has a raw material supply portion, in which the temperature of the raw material supply portion may be set to a first apparatus temperature in the step of holding the SiC substrate, and the temperature of the raw material supply portion may be set to a second apparatus temperature lower than the first apparatus temperature in the step of growing the InAlN layer. In addition, the first apparatus temperature may be 60° C. or higher, and the second apparatus temperature may be 30° C. or lower. In these cases, a deposit including Ga is satisfactorily removed in the step of holding the SiC substrate.

DESCRIPTION OF EMBODIMENTS OF PRESENT DISCLOSURE

The knowledge of the present disclosure can be easily understood in view of the following detailed description with reference to the attached illustrative drawings. Hereinafter, a detail description is made of preferred embodiments of the present disclosure with reference to the attached drawings. In the following description, the similar elements or elements having the same function will be denoted by the same reference symbol, and an overlapping description will be omitted.

First Embodiment

FIG. 1 is a cross-sectional view showing a semiconductor substrate used for a nitride semiconductor device according to the first embodiment. As shown in FIG. 1, a semiconductor substrate 1 used for a high electron mobility transistor (hereinafter referred to as "HEMT"), an example of a nitride semiconductor device, includes a substrate 10, a buffer layer 12, a channel layer 14, a spacer layer 16, a barrier layer 18, and a cap layer 20. In the semiconductor substrate 1, a nitride semiconductor layer, the buffer layer 12, the channel layer 14, the spacer layer 16, the barrier layer 18, and the cap layer 20 are layered in this order on the substrate 10. Each of the buffer layer 12, the channel layer 14, the spacer layer 16, the barrier layer 18, and the cap layer 20 grows by, for example, a MOCVD method.

The substrate 10 is a semi-insulating SiC substrate (silicon carbide substrate). The buffer layer 12 serves as a buffer layer and a seed layer for the channel layer 14, and is an AlN layer epitaxially grown on the substrate 10. The buffer layer 12 has a thickness of, for example, 10 nm or more and 30 nm or less.

The channel layer 14 is an i-type GaN layer (GaN channel layer) epitaxially grown on the buffer layer 12, which serves as a carrier transit layer. GaN cannot grow directly on the substrate 10 due to its wettability with respect to SiC. Accordingly, the channel layer 14 grows via the AlN in the buffer layer 12. The channel layer 14 has a thickness of, for example, 300 nm or more and 1000 nm or less.

The spacer layer 16 is an AlN layer epitaxially grown on the channel layer 14, which AlN layer is a layer located between the channel layer 14 and the barrier layer 18. The spacer layer 16 has a thickness of, for example, 0.5 nm or more and 2 nm or less.

The barrier layer 18 is a nitride semiconductor layer epitaxially grown on the spacer layer 16, which barrier layer 18 serves as a carrier generation layer. The barrier layer 18 is, for example, a nitride semiconductor layer including In (indium). The barrier layer 18 includes, for example, an InAlN-based compound. In the first embodiment, the barrier layer 18 is an InAlN layer. It is desirable that the amount of gallium (Ga) included in this InAlN layer be small. The barrier layer 18 has a thickness of, for example, 3 nm or more and 10 nm or less. Spontaneous polarization occurs between the channel layer 14 and the barrier layer 18. Thus a two-dimensional electron gas (2DEG) at the interface between the channel layer 14 and the spacer layer 16 and on the side of the channel layer 14 is caused, and a channel region is formed in the channel layer 14.

The cap layer 20 is a GaN layer epitaxially grown on the barrier layer 18. The cap layer 20 has a thickness of, for example, 0 nm or more and 5 nm or less. In other words, the cap layer 20 does not necessarily have to be provided. The cap layer 20 may be formed into n-type.

A protective film may be provided on the semiconductor substrate 1. The protective film is an insulating film such as an SiN film. The protective film is formed by, for example, a low pressure chemical vapor deposition (LPCVD) method, a MOCVD method, or a CVD method. When the MOCVD method is used, the protective film may be formed by an apparatus by which the semiconductor substrate 1 grows. In this case, the protective film can be formed without exposing the semiconductor substrate 1 to air and the like.

Figure 2:
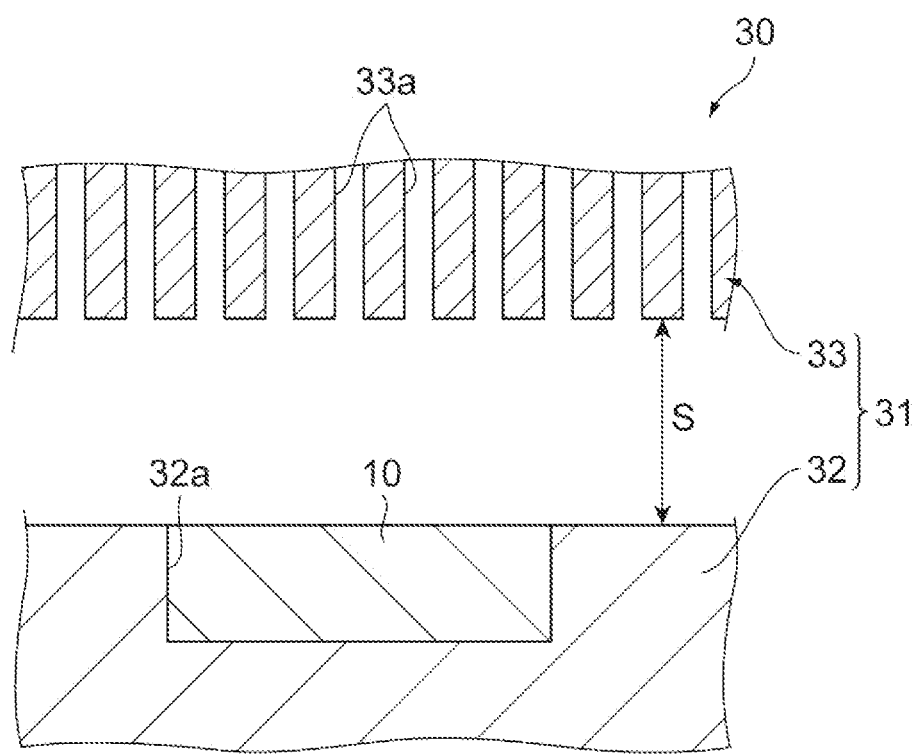
FIG. 2 is a schematic cross-sectional view showing a semiconductor growth apparatus on which a semiconductor substrate is installed.
Figure 3:
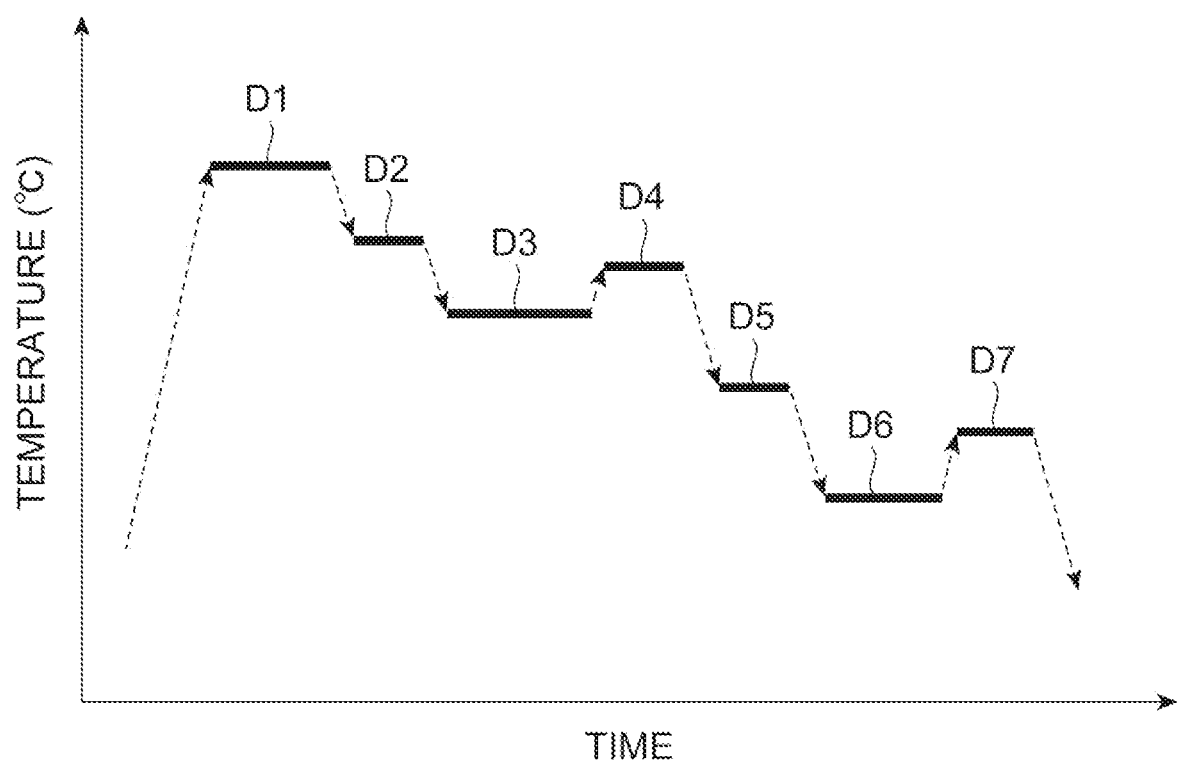
FIG. 3 is a time chart for illustrating the method for manufacturing a nitride semiconductor device according to the first embodiment.
Figure 4A:
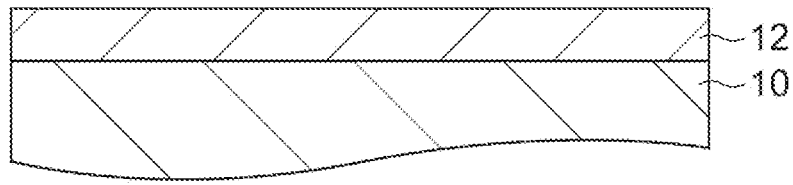
FIG. 4A is a schematic view illustrating the method for manufacturing a nitride semiconductor device according to the first embodiment.
Figure 4B:
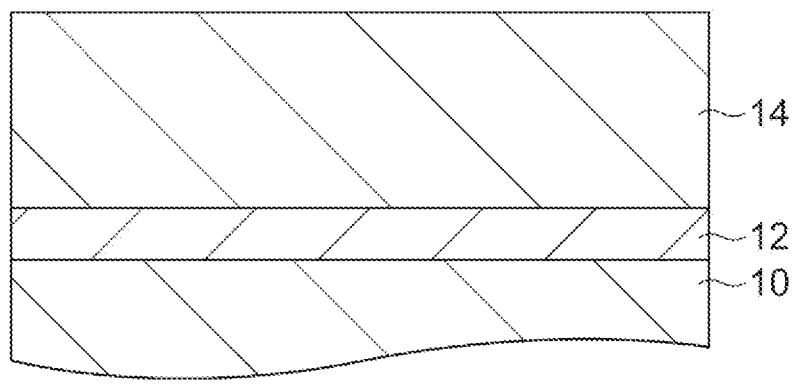
FIG. 4B is a schematic view illustrating the method for manufacturing a nitride semiconductor device according to the first embodiment.
Figure 4C:
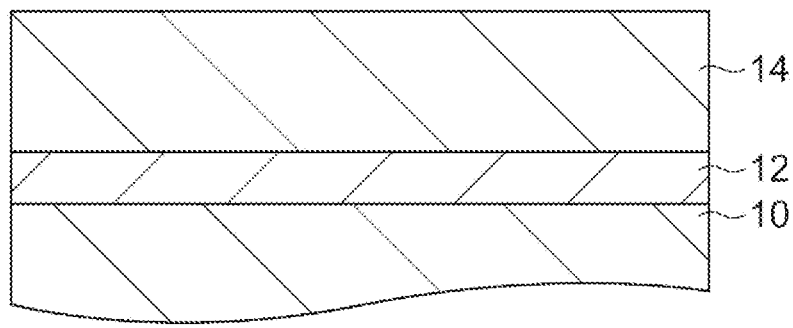
FIG. 4C is a schematic view illustrating the method for manufacturing a nitride semiconductor device according to the first embodiment.
Figure 5A:
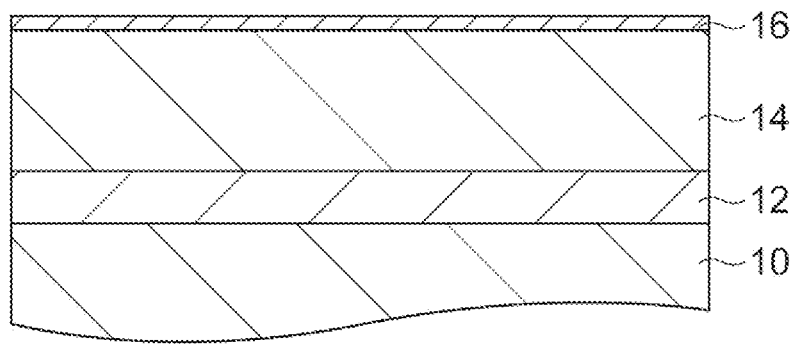
FIG. 5A is a schematic view illustrating the method for manufacturing a nitride semiconductor device according to the first embodiment.
Figure 5B:
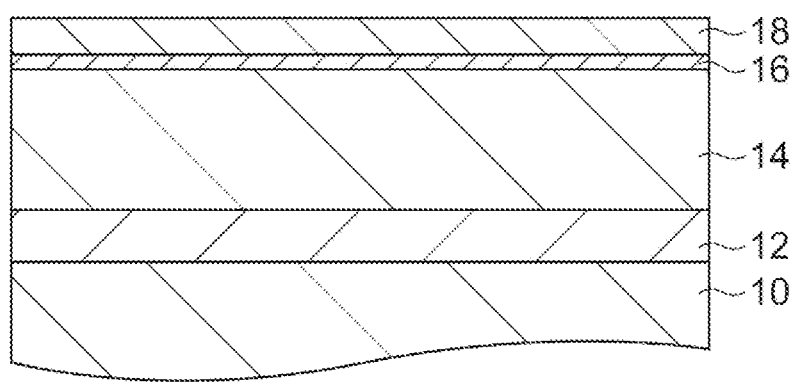
FIG. 5B is a schematic view illustrating the method for manufacturing a nitride semiconductor device according to the first embodiment.
Figure 5C:
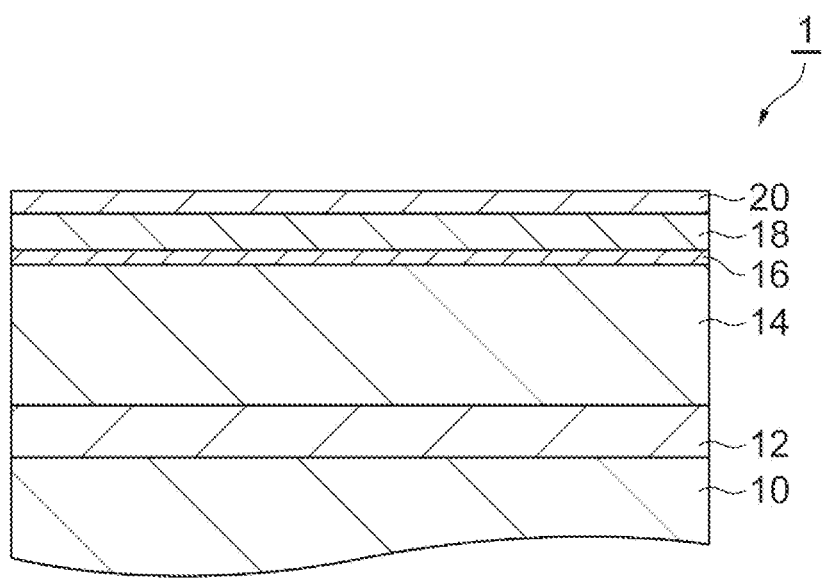
FIG. 5C is a schematic view illustrating the method for manufacturing a nitride semiconductor device according to the first embodiment.
Figure 6A:
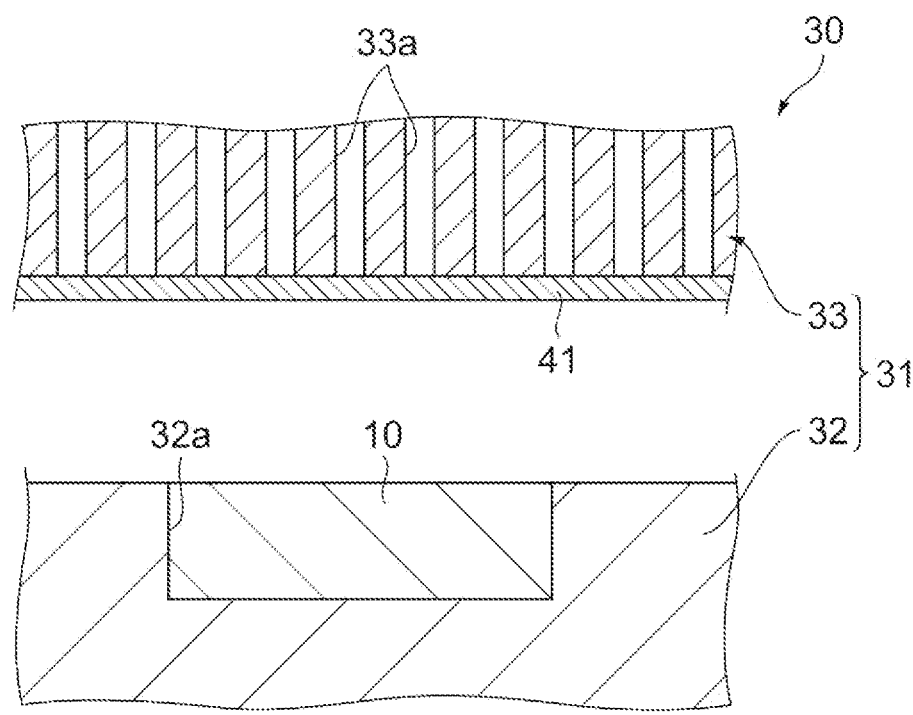
FIG. 6A is a schematic cross-sectional view showing the state inside a furnace after a duration D3.
Figure 6B:
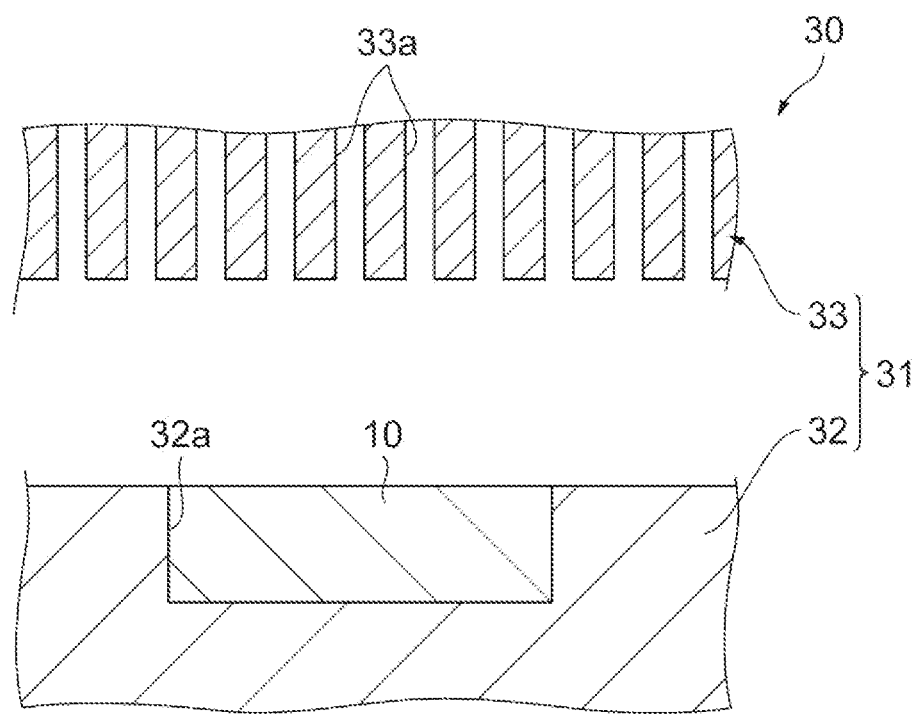
FIG. 6B is a schematic cross-sectional view showing the state inside a furnace after a duration D4.

Next, a description is made of a method for manufacturing a semiconductor substrate 1 with reference to FIGS. 2, 3, 4A to 4C, 5A to 5C, and 6A and 6B. FIG. 2 is a schematic cross-sectional view showing a semiconductor growth apparatus on which a semiconductor substrate is installed. FIG. 3 is a time chart for illustrating the method for manufacturing a nitride semiconductor device according to the first embodiment. FIGS. 4A to 4C and FIGS. 5A to FIG. 5C are schematic views illustrating the method for manufacturing a nitride semiconductor device according to the first embodiment. FIG. 6A is a schematic cross-sectional view showing the state inside a furnace after a duration D3 described below, and FIG. 6B is a schematic cross-sectional view showing the state inside a furnace after a duration D4 described below. In FIG. 3, the horizontal axis represents time and the vertical axis represents temperature. In FIGS. 6A and 6B, the semiconductor grown on the substrate 10 is omitted.

First, as shown in FIG. 2, the substrate 10 is contained in a furnace 31 of a semiconductor growth apparatus 30. In the first embodiment, the semiconductor growth apparatus 30 is a so-called vertical flow type MOCVD apparatus. Accordingly, the furnace 31 is a vertical MOCVD furnace. Thus, a semiconductor layer grows on the substrate 10 contained in the furnace 31 by the MOCVD method. The furnace 31 includes a susceptor 32 (a support portion) on which the substrate 10 is placed (supported), and blowing heads 33 (a raw material supply portion) for ejecting a raw material into the furnace 31. In a region facing the blowing heads 33 of the susceptor 32, a recess portion 32a is provided on which the substrate 10 is placed. The blowing heads 33 are, for example, a shower head having a plurality of ejection holes 33a. The outlet of the ejection hole 33a faces the susceptor 32 in the thickness direction of the substrate 10. The space S between the susceptor 32 and the blowing heads 33 is, for example, 8 mm or more and 12 mm or less.

Next, in a duration D1 shown in FIG. 3, the inside of the furnace 31 is heated with the substrate 10 placed on the susceptor 32. This allows the surface of the substrate 10 and the inside of the furnace 31 to be cleaned. In the step of the duration D1, for example, hydrogen ($H_2$) is supplied into the furnace 31 to bring about a hydrogen atmosphere. In addition, for example, the pressure inside the furnace 31 is reduced, and the inside of the furnace 31 is heated for several tens of minutes in a state at 1100° C. or higher. The temperature in the furnace 31 is set to a temperature higher than the temperature for growth of the semiconductor layer to be performed later. In the first embodiment, in the duration D1, the temperature in the furnace 31 is 1100° C., the inner pressure of the furnace 31 is 100 Torr, and the flow rate of $H_2$ is 20 L/min.

Next, in a duration D2 shown in FIG. 3, the buffer layer 12 grows on the substrate 10 as shown in FIG. 4A. In the step of the duration D2, first, the temperature in the furnace 31 is set to a temperature lower than that in the duration D1. Then, $H_2$ is continuously supplied into the furnace 31 as a carrier gas, and trimethylaluminum (TMA) and ammonia ($NH_3$) are supplied into the furnace 31 as raw materials. Then, an AlN layer serving as the buffer layer 12 grows on the substrate 10. The temperature in the furnace 31 in the duration D2 is, for example, 1000° C. or higher and 1100° C. or lower. In the first embodiment, in the duration D2, the temperature in the furnace 31 is 1080° C., the inner pressure of the furnace 31 is 100 Torr, the flow rate of TMA is 25 cc/min, and the flow rate of $NH_3$ is 10 L/min Then, the buffer layer 12 having a thickness of 20 nm grows.

Next, in a duration D3 shown in FIG. 3, the channel layer 14 grows on the buffer layer 12 as shown in FIG. 4B. In the step of the duration D3, first, the temperature in the furnace 31 is set to a temperature (first temperature) lower than that in the duration D2. Then, using $H_2$ as a carrier gas, and TMG (trimethylgallium) and $NH_3$ as raw materials, they are supplied into the furnace 31. Then, a GaN layer serving as the channel layer 14 grows on the substrate 10. The temperature in the furnace 31 in the duration D3 is, for example, 1000° C. or higher and 1100° C. or lower. In the first embodiment, in the duration D3, the temperature in the furnace 31 is 1010° C., the inner pressure of the furnace 31 is 100 Torr, the flow rate of TMG is 30 cc/min, and the flow rate of $NH_3$ is 20 L/min. Then, the channel layer 14 having a thickness of 1 μm grows.

As described above, since the space S between the susceptor 32 and the blowing heads 33 in the furnace 31 is narrow, Ga atoms tend to adhere to the outlets of the ejection holes 33a and the like in the duration D3. As a result, as shown in FIG. 6A, deposit 41 such as Ga atoms, Ga clusters, and GaN polycrystals may be formed on the surface of the blowing heads 33. When the deposit 41 is formed, Ga is mixed in the semiconductor layer (for example, the spacer layer 16 or the barrier layer 18) grown on the channel layer 14. In this case, the film quality of the semiconductor layer is deteriorated. In order to prevent such a problem, in a duration D4 shown in FIG. 3, the inside of the furnace 31 is kept at a temperature (second temperature) higher than that in the duration D3 for a predetermined period. This removes the deposit 41 from the furnace 31 as shown in FIG. 6B. In the duration D4, first, after the supply of TMG is stopped, the temperature in the furnace 31 is increased. The temperature in the furnace 31 in the duration D4 is set higher than the temperature in the furnace 31 in the duration D3 by 20° C. or more. Then, the substrate 10 on which the channel layer 14 grows is held, for example, for 10 minutes, in the furnace 31 in a state where $H_2$ and $NH_3$ are supplied into the furnace 31. In the first embodiment, in the duration D4, the temperature in the furnace 31 is 1030° C., the inner pressure of the furnace 31 is 200 Torr, and the flow rate of $NH_3$ is 10 L/min.

In the duration D4, the deposit 41 is etched by $H_2$ supplied into the furnace 31. At this time, a part of the channel layer 14 is also etched (see FIG. 4C). Accordingly, in the duration D3, it is preferable to preliminarily grow the channel layer 14 having a thickness larger than the set thickness. In the duration D4, $NH_3$ is supplied into the furnace 31 in order to suppress nitrogen leakage from the channel layer 14.

Next, in a duration D5 shown in FIG. 3, the spacer layer 16 grows on the channel layer 14 as shown in FIG. 5A. In the step of the duration D5, first, the temperature in the furnace 31 is set to a temperature (fourth temperature) lower than that in the duration D4. Then, using $H_2$ as a carrier gas, and TMA and $NH_3$ as raw materials, they are supplied into the furnace 31. Then, an AlN layer serving as the spacer layer 16 grows on the channel layer 14. The temperature in the furnace 31 in the duration D5 is, for example, 900° C. or higher and 1050° C. or lower. In the first embodiment, in the duration D5, the temperature in the furnace 31 is 980° C., the inner pressure of the furnace 31 is 50 Torr, the flow rate of TMA is 40 cc/min, and the flow rate of $NH_3$ is 10 L/min. Then, the spacer layer 16 having a thickness of 1 nm grows.

Next, in a duration D6 shown in FIG. 3, the barrier layer 18 grows on the spacer layer 16 as shown in FIG. 5B. In the step of the duration D6, first, the carrier gas is switched from $H_2$ to nitrogen ($N_2$) in order to prevent the In deposited on the spacer layer 16 from being removed. In addition, the temperature in the furnace 31 is set to a temperature (third temperature) lower than that in the duration D5. Then, using $N_2$ as a carrier gas, and TMA, TMI (trimethylindium), and $NH_3$ as raw materials, they are supplied into the furnace 31. Then, an InAlN layer serving as the barrier layer 18 grows on the spacer layer 16. This InAlN layer includes about half to 15% Ga derived from the deposit 41 and the like as compared to that in a conventional process in which the duration D4 is not provided. The temperature in the furnace 31 in the duration D6 is, for example, 600° C. or higher and 800° C. or lower. In the first embodiment, in the duration D6, the temperature in the furnace 31 is 700° C., the inner pressure of the furnace 31 is 50 Torr, the flow rate of TMA is 5 cc/min, the flow rate of TMI is 50 cc/min, and the flow rate of $NH_3$ is 4 L/min. Then, the barrier layer 18 having a thickness of 8 nm grows.

Next, in a duration D7 shown in FIG. 3, the cap layer 20 grows on the barrier layer 18 as shown in FIG. 5C. In the step of the duration D7, first, the temperature in the furnace 31 is set to a temperature higher than that in the duration D6. Then, using $N_2$ as a carrier gas, and TMG and $NH_3$ as raw materials, they are supplied into the furnace 31. Then, a GaN layer serving as the cap layer 20 grows on the barrier layer 18. The temperature in the furnace 31 in the duration D7 is, for example, 700° C. or higher and 900° C. or lower. In the first embodiment, in the duration D7, the temperature in the furnace 31 is 800° C., the inner pressure of the furnace 31 is 50 Torr, the flow rate of TMG is 10 cc/min, and the flow rate of $NH_3$ is 4 L/min. Then, the cap layer 20 having a thickness of 3 nm grows.

Through the above durations D1 to D7, the semiconductor substrate 1 is formed on the substrate 10. Using the semiconductor substrate 1, HEMT, a nitride semiconductor device, or the like can be formed.

Figure 7:
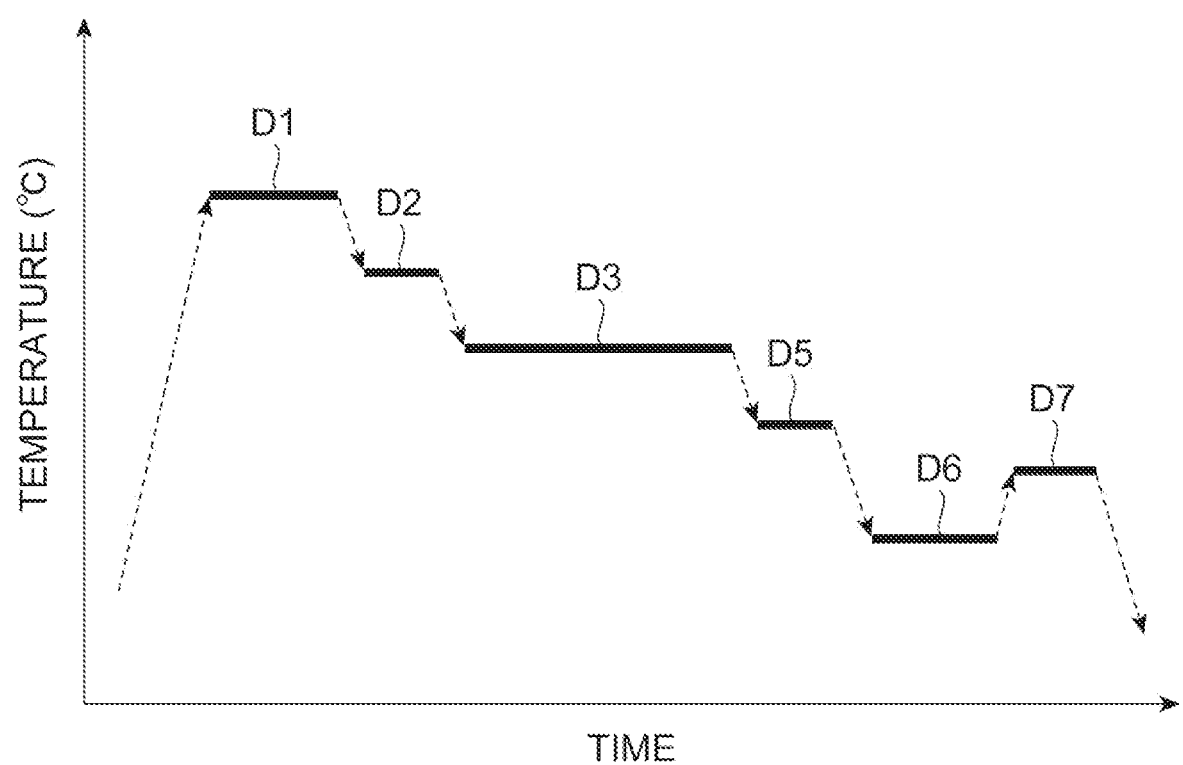
FIG. 7 is a time chart for illustrating a conventional method for manufacturing a nitride semiconductor device.
Figure 8A:
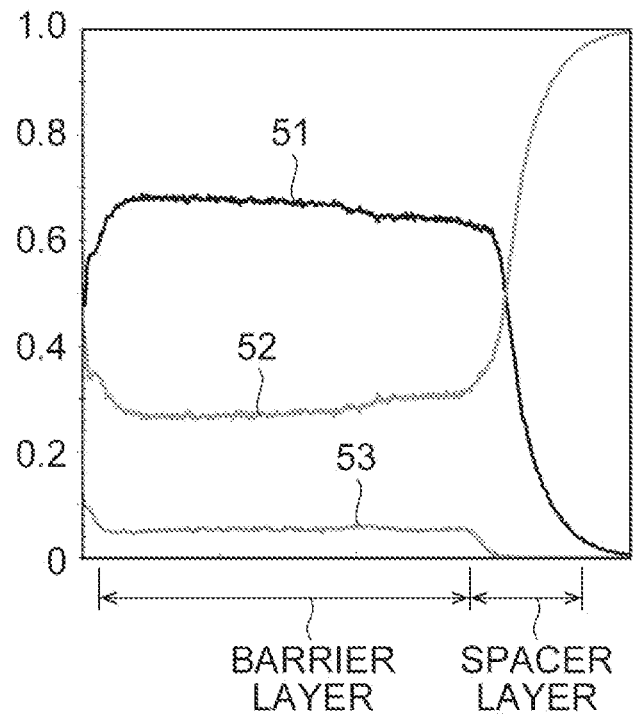
FIG. 8A is a diagram showing an SIMS measurement result of a barrier layer and a spacer layer grown by a conventional manufacturing method.
Figure 8B:
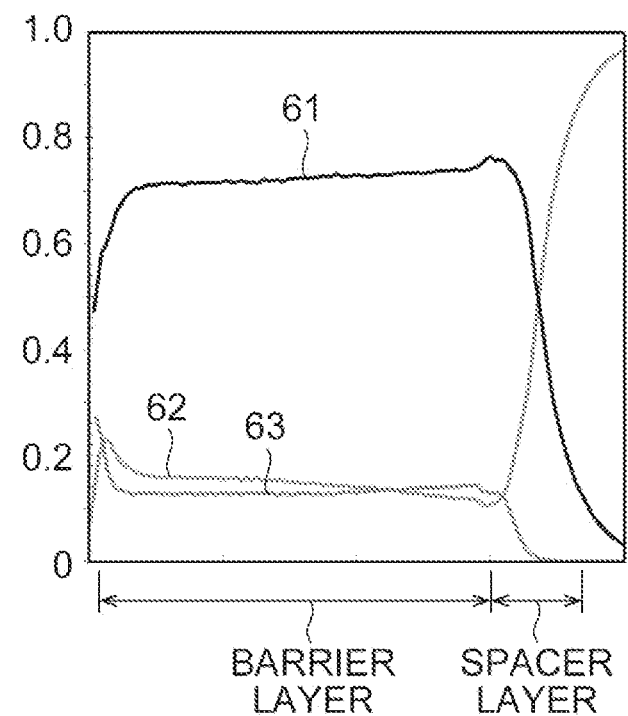
FIG. 8B is a diagram showing an SIMS measurement result of a barrier layer and a spacer layer grown by the manufacturing method according to the first embodiment.

A description is made of the operational effects achieved by the method for manufacturing a nitride semiconductor device described above with reference to FIGS. 7, and 8A and 8B. FIG. 7 is a time chart for illustrating a conventional method for manufacturing a nitride semiconductor device. FIG. 8A is a diagram showing an SIMS measurement result of a barrier layer and a spacer layer grown by a conventional manufacturing method, and FIG. 8B is a diagram showing an SIMS measurement result of a barrier layer and a spacer layer grown by the manufacturing method according to the first embodiment. In FIGS. 8A and 8B, the horizontal axis represents the distance from the surface of the barrier layer, and the vertical axis represents the composition of constituent elements. Plots 51 and 61 show Al measurement results, plots 52 and 62 show Ga measurement results, and plots 53 and 63 show In measurement results. In FIGS. 8A and 8B, the vertical axis is shown using a linear scale, in which the total composition of Al, Ga, and In is 1.

As shown in FIG. 7, conventionally, the step of duration D4 is not performed. Thus, conventionally, the spacer layer, the barrier layer, and the cap layer grow in a state where the deposit 41 is formed on the blowing heads 33 in the duration D3. In this case, In atoms included in TMI tend to be replaced with Ga atoms in the deposit 41. Accordingly, when an InAlN layer serving as the barrier layer grows after the duration D3, an AlGaN layer including In (that is, an InAlN-based crystal including a large amount of Ga) will grow. In fact, as shown in FIG. 8A, the composition of Ga in the barrier layer is clearly higher than that of In. It is assumed that the replacement of In atoms with Ga atoms is promoted by heating the blowing heads 33 and the deposit 41 in the furnace 31.

When a GaN substrate is included in the semiconductor growth apparatus 30 and an InAlN layer grows directly on the GaN substrate, an InAlN layer including substantially no Ga will grow. From this, it can be seen that the presence of the deposit 41 causes a large amount of Ga to be mixed in the barrier layer and the like. In addition, it can be seen that the deposit 41 is not completely removed only by supplying $H_2$.

On the other hand, in the manufacturing method according to the first embodiment, the step of the duration D4 is performed. It makes it possible to satisfactorily remove the deposit 41 before the growth of the spacer layer 16 and the barrier layer 18. In fact, as shown in FIG. 8B, the composition of Ga in the barrier layer 18 is lower than the conventional one, and the composition of In in the barrier layer 18 is obviously higher than the conventional one. In addition, the composition ratio of each atom in the barrier layer 18 in the thickness direction of the semiconductor substrate 1 is stabilized. Thus, according to the first embodiment, a high-quality barrier layer 18 including an InAlN-based compound can grow.

In general, as the Ga concentration in an InAlN-based crystal increases, the a-axis of the crystal tends to separate from GaN. In this case, the strain in the InAlN-based crystal including Ga becomes large. When the strain becomes large, there is a tendency that cracks occur in the InAlN-based crystal and surface pits increase. When a nitride semiconductor device (HEMT, FET) is manufactured using such an InAlN-based crystal, the leak current in the device tends to increase. Accordingly, as Ga is included in the InAlN-based crystal more, the performance and reliability of the nitride semiconductor device tend to be lower. Therefore, it can be said that it is useful to grow the high-quality barrier layer 18 including an InAlN-based compound by applying the manufacturing method according to the first embodiment.

In the duration D4, $H_2$ etches a part of the channel layer 14. However, the sheet resistance of the etched channel layer 14 is substantially the same as the sheet resistance of the channel layer 14 before being etched. In addition, the surface morphology of the semiconductor substrate 1 tends to exhibit no major defects. Furthermore, the channel layer 14 is less likely to be damaged than in the case where an HCl gas is supplied as described in Patent Literature 2.

As in the first embodiment, the second temperature set in the duration D4 may be higher than the first temperature set in the duration D3 by 20° C. or more. In this case, the deposit 41 can be satisfactorily removed.

As in the first embodiment, after the step of the duration D4 and before the step of the duration D6, an AlN layer may grow on the channel layer 14 using the MOCVD furnace set at a temperature lower than the first temperature using $N_2$ as a carrier gas, and TMA and $NH_3$ as raw materials. In this case, it is possible to prevent alloy scattering from occurring at the interface between the channel layer 14 and the barrier layer 18. This makes it possible to suppress a decrease in mobility of the HEMT in which the semiconductor substrate 1 is used. In addition, it is possible to suppress a decrease in carrier density in the barrier layer 18.

As in the first embodiment, the furnace 31 includes a susceptor 32 on which the substrate 10 is placed, and blowing heads 33 for ejecting a raw material, in which the space S between the susceptor 32 and the blowing heads 33 may be 8 mm or more and 12 mm or less. In this case, a raw material can reach the substrate 10 before the thermal decomposition of the raw material occurs, so that a semiconductor layer can efficiently epitaxially grow on the substrate 10. On the other hand, when the space S is set within the above range, Ga tends to adhere to the blowing heads 33 and the like. In other words, when the space S is set within the above range, the deposit 41 is likely to be formed. However, according to the first embodiment, the deposit 41 is satisfactorily removed in the duration D4, so that a semiconductor layer can efficiently epitaxially grow with the deterioration of the film quality of the barrier layer 18 suppressed.

Hereinafter, a description is made of a modified example of the first embodiment with reference to FIGS. 9 and 10A to 10C. In the following modified example, a description of the same portions as those in the first embodiment will be omitted. Accordingly, the points different from the first embodiment will be mainly described below.

Figure 9:
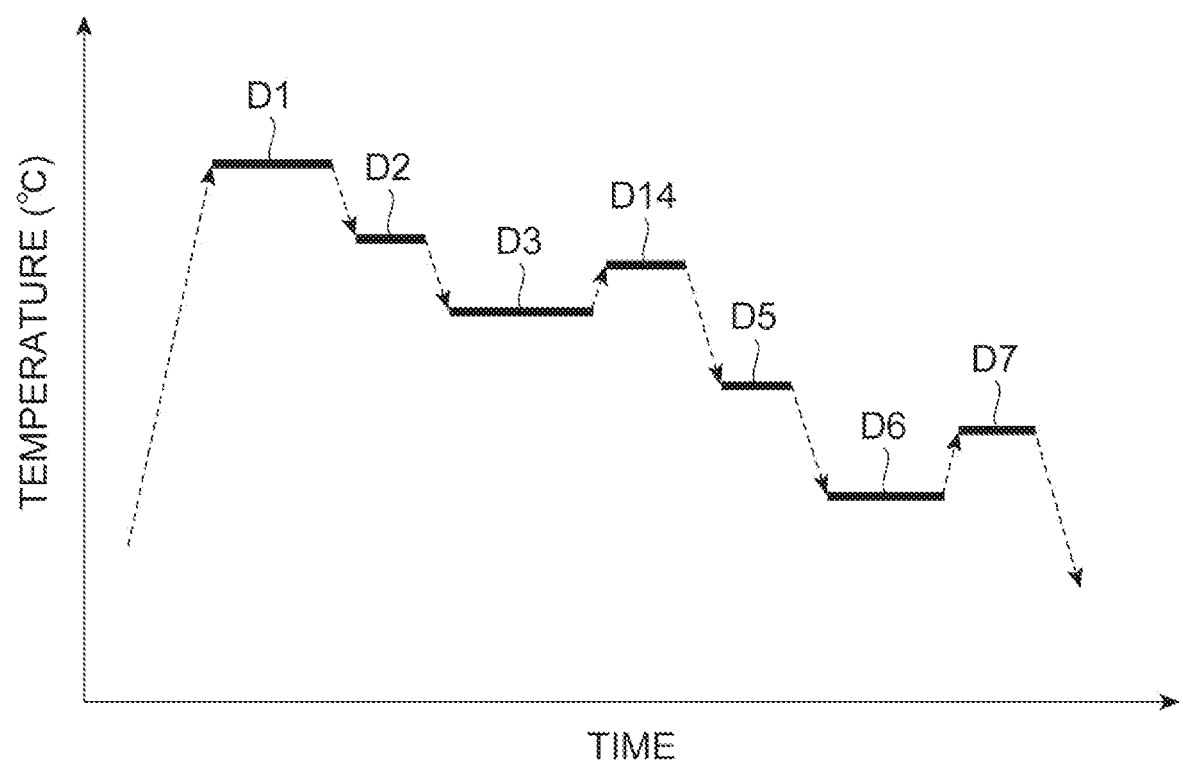
FIG. 9 is a time chart for illustrating the method for manufacturing a nitride semiconductor device according to the modified example.

FIG. 9 is a time chart for illustrating the method for manufacturing a nitride semiconductor device according to the modified example. As shown in FIG. 9, the time chart of the modified example shows a duration D14 different from the duration D4 in the first embodiment. The duration D14 is located between the durations D3 and D5, and the temperature is set to the similar temperature as in the duration D4. In the duration D14, $H_2$, $NH_3$, and TMI are supplied into the furnace 31. The flow rate of TMI is, for example, 500 cc.

In the modified example, TMI is supplied to the furnace 31, so that Ga in the deposit 41 (see FIG. 6A) is replaced with In. This facilitates Ga removal. In addition, the temperature in the furnace 31 exceeds 1000° C., and $H_2$ is supplied into the furnace 31. As a result, the replaced In is sublimated, and In is not deposited on the channel layer 14. Accordingly, in the duration D14, the deposit 41 is more satisfactorily removed. Thus, according to the modified example, a higher quality barrier layer 18 including an InAlN-based compound can grow. However, the temperature in the furnace 31 is not limited to this. By supplying TMI and $H_2$ at the same time, the deposit 41 can be satisfactorily removed even when the temperature in the furnace 31 is, for example, 1000° C. or higher and equal to or less than the temperature in the immediately preceding duration D3 for growing the GaN layer.

Figure 10A:
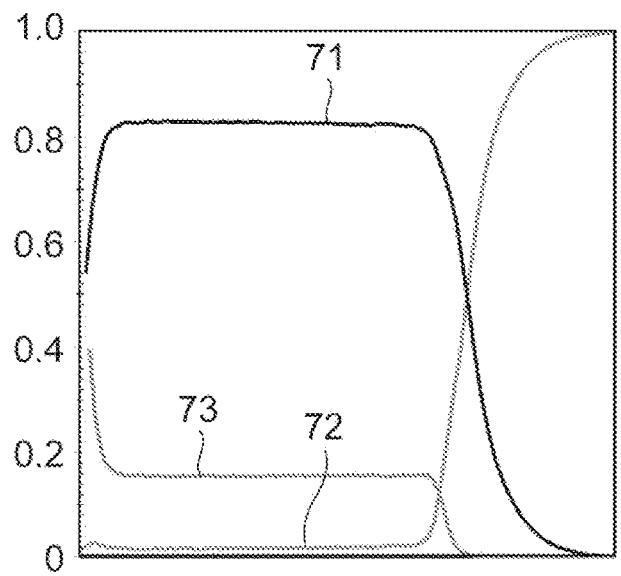
FIG. 10A is a diagram showing an SIMS measurement result of a barrier layer and a spacer layer grown by the manufacturing method according to the modified example.

FIG. 10A is a diagram showing an SIMS measurement result of a barrier layer and a spacer layer grown by the manufacturing method according to the above modified example. In FIG. 10A, a plot 71 shows an Al measurement result, a plot 72 shows a Ga measurement result, and a plot 73 shows an In measurement result. As shown in FIG. 10A, the composition of Ga in the barrier layer 18 of the above modified example is still lower than that of the first embodiment. Specifically, the composition of Ga in the barrier layer 18 of the above modified example is 0.04 or less.

Figure 10B:
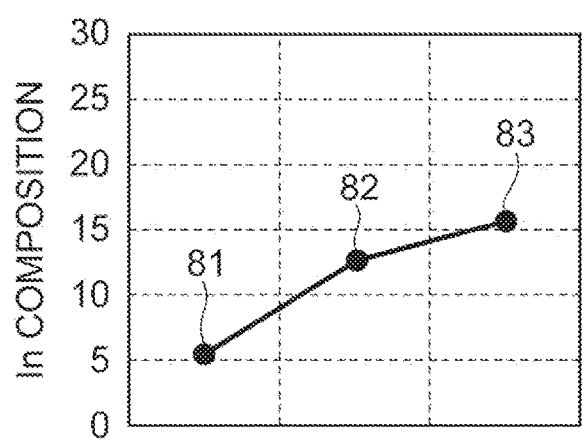
FIG. 10B is a diagram showing In compositions in a conventional art, the first embodiment, and the modified example.

FIG. 10B is a diagram showing In compositions in a conventional art, the first embodiment, and the modified example. In FIG. 10B, the reference sign 81 represents the In composition in the conventional barrier layer, the reference sign 82 represents the In composition in the barrier layer of the first embodiment, and the reference sign 83 represents the In composition in the barrier layer of the modified example. As shown in FIG. 10B, the In composition in the barrier layer of the modified example is the highest, and the In composition in the conventional barrier layer is the lowest.

Figure 10C:
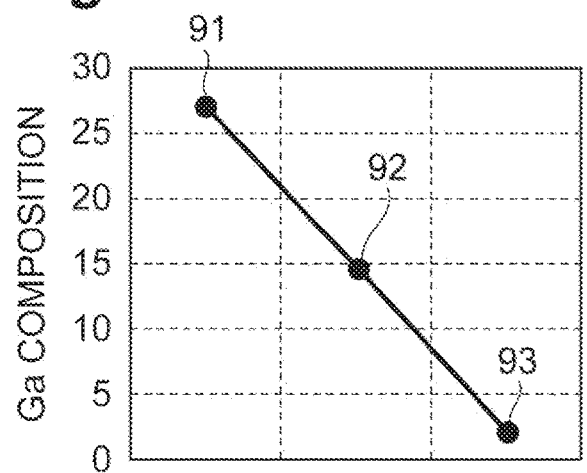
FIG. 10C is a diagram showing Ga compositions in a conventional art, the first embodiment, and a modified example.

FIG. 10C is a diagram showing Ga compositions in a conventional art, the first embodiment, and the modified example. In FIG. 10C, the reference sign 91 represents the Ga composition in the conventional barrier layer, the reference sign 92 represents the Ga composition in the barrier layer of the first embodiment, and the reference sign 93 represents the Ga composition in the barrier layer of the modified example. As shown in FIG. 10C, the Ga composition in the conventional barrier layer is the highest (about 27%), and the Ga composition in the barrier layer of the modified example is the lowest. From these results, the film quality of the barrier layer can be improved in both the first embodiment and the modified example, as compared to the conventional one.

In the first embodiment and the modified example, the case is shown where the spacer layer 16 is formed at 980° C. and $H_2$ is used as the carrier gas, but the growth condition for the spacer layer 16 is not limited to this example. For example, the carrier gas may be $N_2$. When the growth temperature of the spacer layer 16 is close to the growth temperature of the channel layer 14, nitrogen ($N_2$) may also be used as a carrier gas. In addition, when it is close to the growth temperature of the barrier layer 18, $H_2$ may also be used.

Second Embodiment

Hereinafter, a description is made of a second embodiment with reference to FIGS. 11A to 11C. In the second embodiment, a description of the same portions as those in the first embodiment will be omitted. Accordingly, the points different from the first embodiment will be mainly described below.

Figure 11A:
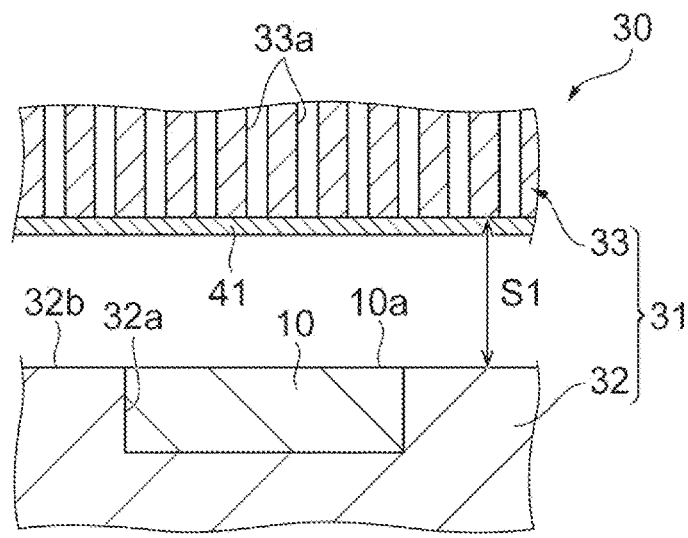
FIG. 11A is a schematic view illustrating the method for manufacturing a nitride semiconductor device according to the second embodiment.
Figure 11B:
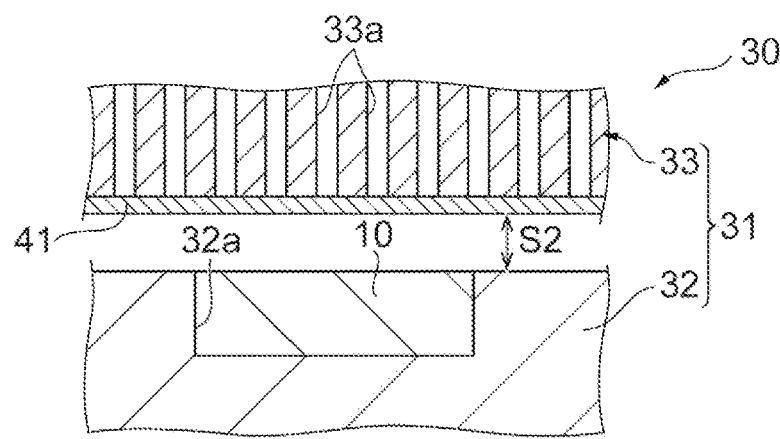
FIG. 11B is a schematic view illustrating the method for manufacturing a nitride semiconductor device according to the second embodiment.
Figure 11C:
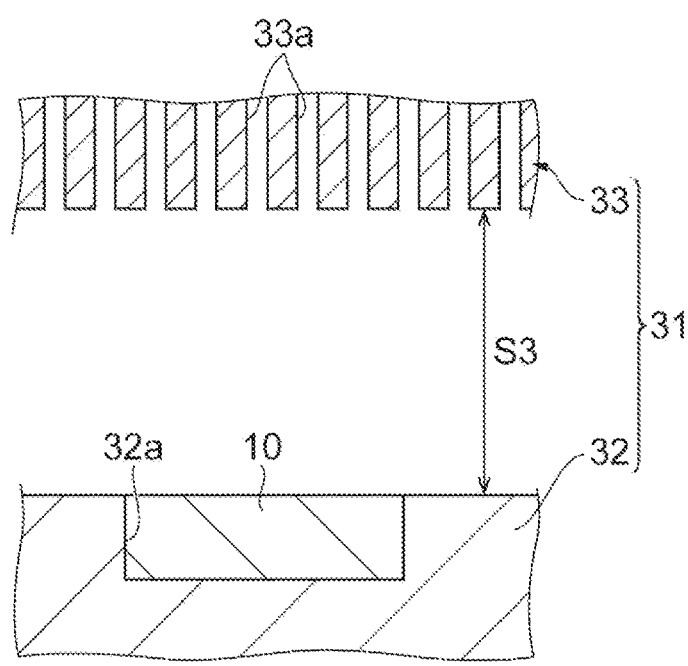
FIG. 11C is a schematic view illustrating the method for manufacturing a nitride semiconductor device according to the second embodiment.

FIGS. 11A to 11C are schematic views illustrating the method for manufacturing a nitride semiconductor device according to the second embodiment. FIG. 11A is a schematic cross-sectional view showing a state in the furnace after the duration D3 in the second embodiment, FIG. 11B is a schematic cross-sectional view showing a state in the furnace in the duration D4 in the second embodiment, and FIG. 11C is a schematic cross-sectional view showing a state in the furnace in the duration D6 in the second embodiment. As shown in FIG. 11A, in the second embodiment, the surface 32b of the susceptor 32 facing the blowing heads 33 and the surface 10a of the substrate 10 facing the blowing heads 33 are considered to be on the same plane. Thus, in the thickness direction of the substrate 10, the space between the susceptor 32 and the blowing heads 33 corresponds to the space between the substrate 10 and the blowing heads 33.

After the duration D3, the space S1 between the substrate 10 and the blowing heads 33 is, for example, 8 mm or more and 12 mm or less. In the duration D3 of the second embodiment, a GaN layer having a thickness of 1 μm will grow, for example, under the same condition as in the first embodiment.

As shown in FIG. 11B, the space S2 (first space) between the substrate 10 and the blowing heads 33 in the duration D4 is narrower than the space S1. In other words, in the duration D4, the space between the substrate 10 and the blowing heads 33 is set to the space S2 narrower than the space S1. By moving the blowing heads 33 toward the susceptor 32 side using an actuator or the like, the susceptor 32 and the blowing heads 33 come close to each other in the duration D4. The movement of the blowing heads 33 is performed, for example, in the duration D4. The blowing heads 33 may move in the furnace 31 during the temperature rise, may move before the temperature rise, or may move after the temperature rise. The space S2 is, for example, 2 mm or more and 6 mm or less. When the space S2 is 6 mm or less, the surface temperature of the blowing heads 33 is likely to be so high that the deposit 41 is easily removed. In the duration D4 of the second embodiment, the deposit 41 is removed under the same conditions as in the first embodiment except for the space S2.

As shown in FIG. 11C, the space S3 (second space) between the substrate 10 and the blowing heads 33 in the duration D6 is wider than the space S1. In other words, in the duration D6, the space between the substrate 10 and the blowing heads 33 is set to the space S3 wider than the space S1. By moving the blowing heads 33 away from the susceptor 32 using an actuator or the like, the blowing heads 33 separate from the susceptor 32 in the duration D6. The movement of the blowing heads 33 is performed, for example, in the duration D6. The blowing heads 33 may move in the furnace 31 during the temperature fall, may move before the temperature fall, or may move after the temperature fall. The blowing heads 33 may move before supplying the TMI into the furnace 31, or may move during supplying TMI into the furnace 31. The space S3 is, for example, 15 mm or more and 20 mm or less. When the space S3 is 15 mm or more, Ga remaining on the blowing heads 33 does not easily reach the susceptor 32, so that the InAlN layer is less likely to include Ga. In addition, when the space S3 is 20 mm or less, it is possible to prevent the growth rate of the InAlN layer from remarkably decreasing. In the duration D6 of the second embodiment, an InAlN layer having a thickness of 8 nm grows under the same conditions as in the first embodiment except for the space S3.

Also in the manufacturing method according to the second embodiment described above, the same operational effects as those of the first embodiment are achieved. In addition, the deposit 41 is easily removed by narrowing the space between the substrate 10 and the blowing heads 33 in the duration D4. For example, by setting the space between the substrate 10 and the blowing heads 33 to 6 mm or less in the duration D4, the deposit 41 is easily satisfactorily removed. Furthermore, by enlarging the space between the substrate 10 and the blowing heads 33 in the duration D6, it becomes difficult for Ga included in the deposit 41 remaining on the blowing heads 33 to reach the InAlN layer. Accordingly, the InAlN layer is less likely to include Ga. For example, by setting the space between the substrate 10 and the blowing heads 33 to 15 mm or more in the duration D6, the InAlN layer is less likely to include Ga.

In the second embodiment, the space between the substrate 10 and the blowing heads 33 in the duration D5 is set to the space S2, but is not limited to this. For example, the space between the substrate 10 and the blowing heads 33 in the duration D5 may be wider than the space S2. In this case, the space between the substrate 10 and the blowing heads 33 in the duration D5 may be reset to the space S1 or set to the space S3. For example, the space between the substrate 10 and the blowing heads 33 in the duration D5 may be set to 15 mm.

Third Embodiment

Hereinafter, a description is made of a third embodiment with reference to FIGS. 12A to 12C. In the third embodiment, a description of the same portions as those in the first and second embodiments will be omitted. Accordingly, the points different from the first and second embodiments will be mainly described below.

Figure 12A:
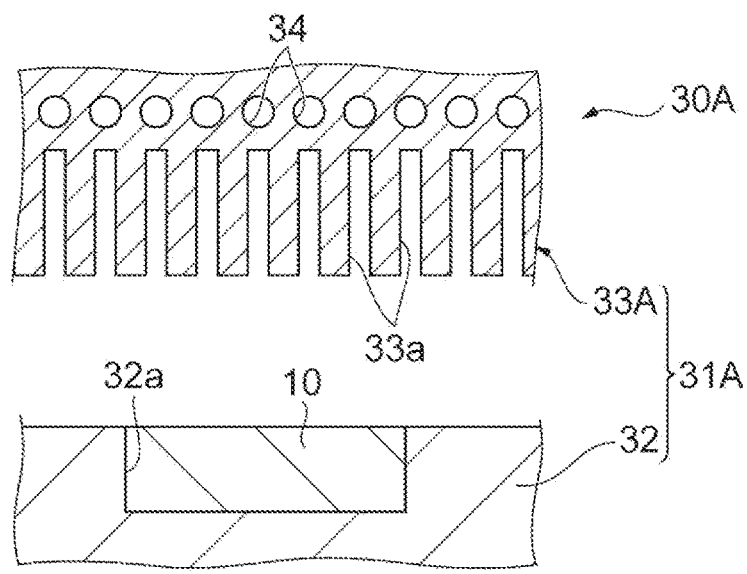
FIG. 12A is a schematic view illustrating the method for manufacturing a nitride semiconductor device according to the third embodiment.
Figure 12B:
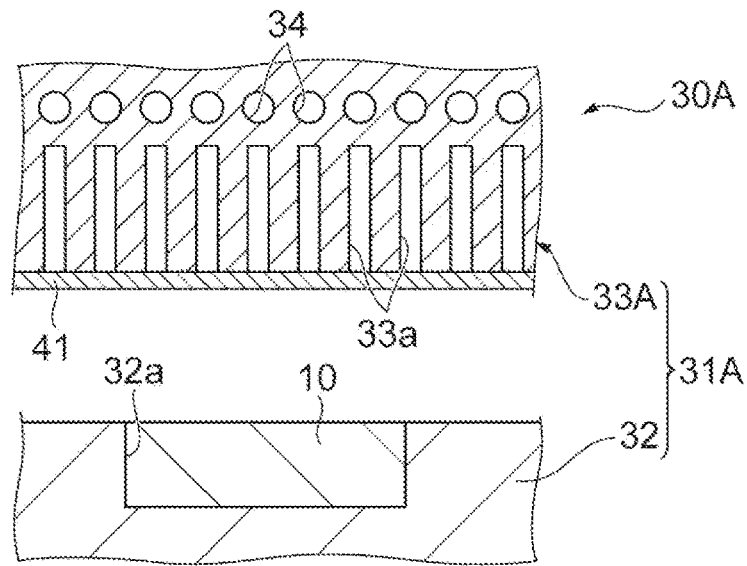
FIG. 12B is a schematic view illustrating the method for manufacturing a nitride semiconductor device according to the third embodiment.
Figure 12C:
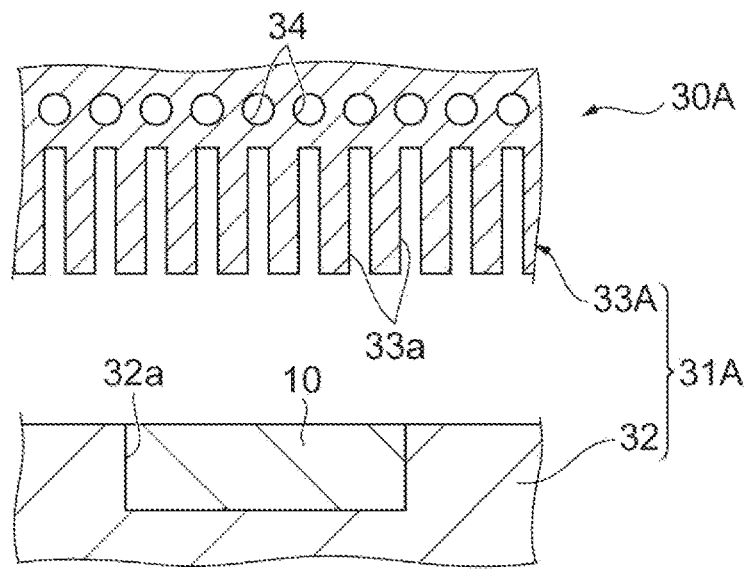
FIG. 12C is a schematic view illustrating the method for manufacturing a nitride semiconductor device according to the third embodiment.

FIGS. 12A to 12C are schematic views illustrating the method for manufacturing a nitride semiconductor device according to the third embodiment. FIG. 12A is a schematic cross-sectional view showing a state in the furnace in the duration D1 in the third embodiment, FIG. 12B is a schematic cross-sectional view showing a state in the furnace in the duration D4 in the third embodiment, and FIG. 12C is a schematic cross-sectional view showing a state in the furnace in the duration D6 in the third embodiment. As shown in FIGS. 12A to 12C, in the third embodiment, the furnace 31A of the semiconductor growth apparatus 30A has the susceptor 32, and blowing heads 33A provided with the plurality of ejection holes 33a and a plurality of cooling passages 34. The cooling passage 34 is a cavity through which a refrigerant passes, and is provided on the base end side of the ejection hole 33a (opposite to the susceptor 32 via the ejection hole 33a). The refrigerant is used to maintain the temperature of the blowing heads 33A within a predetermined range, and is, for example, gas or liquid. The temperature of the refrigerant is variable. In the third embodiment, water is used as the refrigerant, but the refrigerant is not limited to this.

In the third embodiment, the surface temperature of the blowing heads 33A corresponds to the apparatus temperature of the blowing heads 33A, but is not limited to this. For example, the temperature of the refrigerant supplied to the cooling passages 34 may be regarded as the surface temperature (apparatus temperature) of the blowing heads 33A. In this case, when the temperature of a refrigerant supplied to the cooling passages 34 is 50° C., the apparatus temperature of the blowing heads 33A is considered to be 50° C. The temperature of the refrigerant supplied to the cooling passages 34 corresponds to the temperature of the refrigerant immediately before being introduced into the cooling passages 34.

In FIG. 12A, the refrigerant is supplied to the cooling passages 34 such that the apparatus temperature of the blowing heads 33A becomes a temperature T1. The temperature T1 is, for example, 40° C. or higher and 60° C. or lower. In the third embodiment, the temperature T1 is set to 50° C. Thus, the refrigerant having a temperature that can set the temperature T1 to 50° C. is supplied to the cooling passages 34. The refrigerant is supplied, for example, from the duration D1 to the duration D3.

In FIG. 12B, the refrigerant is supplied to the cooling passages 34 such that the apparatus temperature of the blowing heads 33A becomes a temperature T2. The temperature T2 is higher than the temperature T1, and is, for example, 60° C. or higher and 90° C. or lower. In this case, the deposit 41 located on the blowing heads 33A is easily removed. In other words, Ga included in the deposit 41 tends to be released. In the third embodiment, the temperature T2, an apparatus temperature of the blowing heads 33A in the duration D4 (first apparatus temperature), is set to 70° C. Thus, the refrigerant having a temperature that can set the temperature T2 to 70° C. is supplied to the cooling passages 34. The refrigerant is supplied, for example, from the duration D4 to the duration D5.

In FIG. 12C, the refrigerant is supplied to the cooling passages 34 such that the apparatus temperature of the blowing heads 33A becomes a temperature T3. The temperature T3 is lower than the temperature T2, and is, for example, 20° C. or higher and 40° C. or lower. In this case, the deposit 41 remaining on the blowing heads 33A becomes difficult to remove. In other words, Ga included in the deposit 41 tends not to be released. The temperature T3, an apparatus temperature of the blowing heads 33A in the duration D6 (second apparatus temperature), may be lower than the temperature T1. In the third embodiment, the temperature T3 is set to 30° C. Thus, the refrigerant having a temperature that can set the temperature T3 to 30° C. is supplied to the cooling passages 34. The refrigerant is supplied, for example, from the duration D6 to the duration D7.

Also in the manufacturing method according to the third embodiment described above, the same operational effects as those of the first embodiment are achieved. In addition, the amount of Ga released from the deposit 41 is proportional to the apparatus temperature of the blowing heads 33A. Thus, the deposit 41 is easily removed by raising the apparatus temperature of the blowing heads 33A in the duration D4. For example, by setting the apparatus temperature of the blowing heads 33A to 60° C. or higher in the duration D4, the deposit 41 is easily satisfactorily removed. Furthermore, by lowering the apparatus temperature of the blowing heads 33A in the duration D6, it becomes difficult for Ga included in the deposit 41 remaining on the blowing heads 33A to reach the InAlN layer. Accordingly, the InAlN layer is less likely to include Ga. For example, by setting the apparatus temperature of the blowing heads 33A to 30° C. or lower in the duration D6, the InAlN layer is less likely to include Ga.

In the third embodiment, the apparatus temperature of the blowing heads 33A in the duration D5 is set to the temperature T2, but is not limited to this. For example, the apparatus temperature of the blowing heads 33A in the duration D5 may be lower than the temperature T2. In this case, the apparatus temperature of the blowing heads 33A in the duration D5 may be reset to the temperature T1 or may be set to the temperature T3.

Fourth Embodiment

Hereinafter, a description is made of the fourth embodiment. In the fourth embodiment, a description of the same portions as those in the first to third embodiments will be omitted. Accordingly, the points different from the first to third embodiments will be mainly described below.

The fourth embodiment is an embodiment in which the second embodiment and the third embodiment are combined. Accordingly, in the duration D4, the space between the blowing heads 33A and the substrate 10 is set to the space S2, and the apparatus temperature of the blowing heads 33A is set to the temperature T2. In addition, in the duration D6, the space between the blowing heads 33A and the substrate 10 is set to the space S3, and the apparatus temperature of the blowing heads 33A is set to the temperature T3.

Also in the manufacturing method according to the fourth embodiment described above, the same operational effects as those of the first embodiment are achieved. In addition, the InAlN layer more satisfactorily becomes difficult to include Ga.

Figure 13:
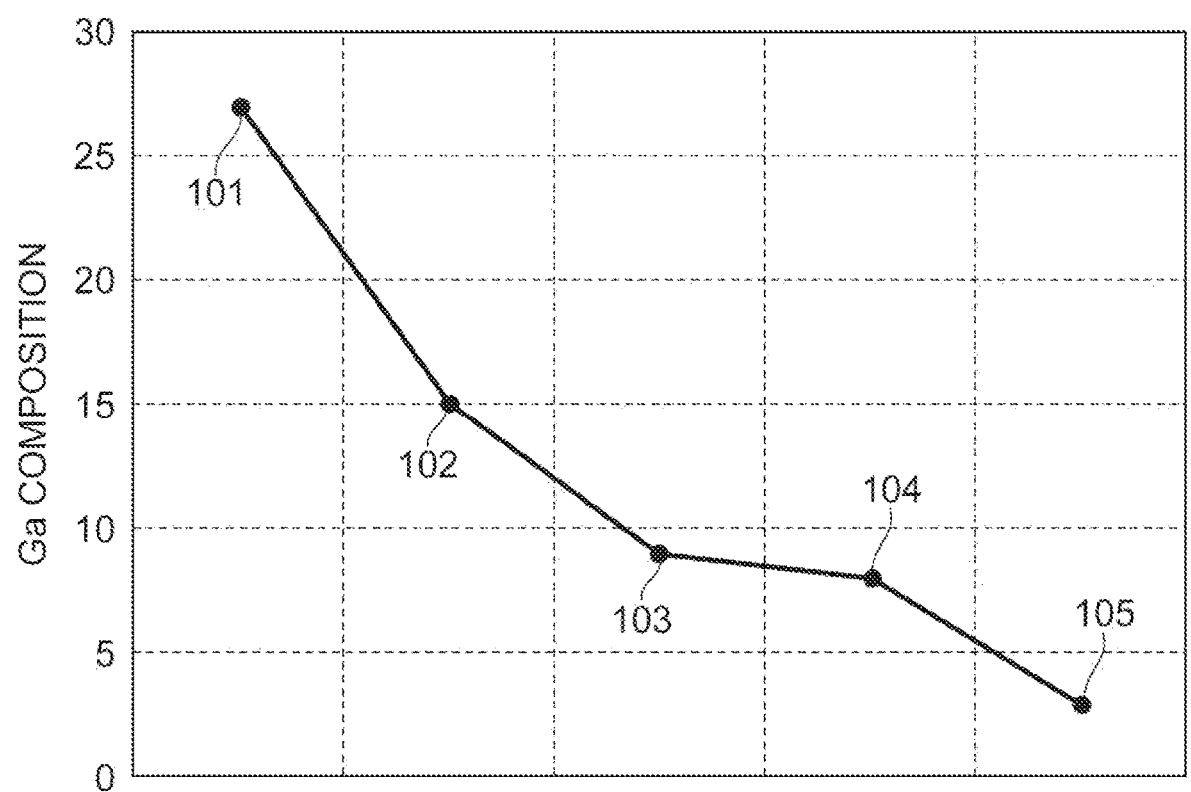
FIG. 13 is a diagram showing Ga compositions in a conventional art, and the first, second, third, and fourth embodiments.

FIG. 13 is a diagram showing Ga compositions in a conventional art, and the first, second, third, and fourth embodiments. In FIG. 13, the reference sign 101 represents the Ga composition in a conventional barrier layer, the reference sign 102 represents the Ga composition in the barrier layer of the first embodiment, the reference sign 103 represents the Ga composition in the barrier layer of the second embodiment, the reference sign 104 represents the Ga composition in the barrier layer of the third embodiment, and the reference sign 105 represents the Ga composition in the barrier layer of the fourth embodiment. As shown in FIG. 13, the Ga composition in the barrier layer of the second embodiment (about 9%) and the Ga composition in the barrier layer of the third embodiment (about 8%) are both lower than the Ga composition in the barrier layer of the first embodiment (about 15%). In addition, the Ga composition in the barrier layer of the fourth embodiment is about 3%. Accordingly, the film quality of the barrier layer can be further improved by performing at least one of adjustment of the space between the blowing head and the susceptor and adjustment of the temperature of the blowing heads. In addition, by performing both of the adjustments, the film quality of the barrier layer can be more satisfactorily improved.

Figure 14:
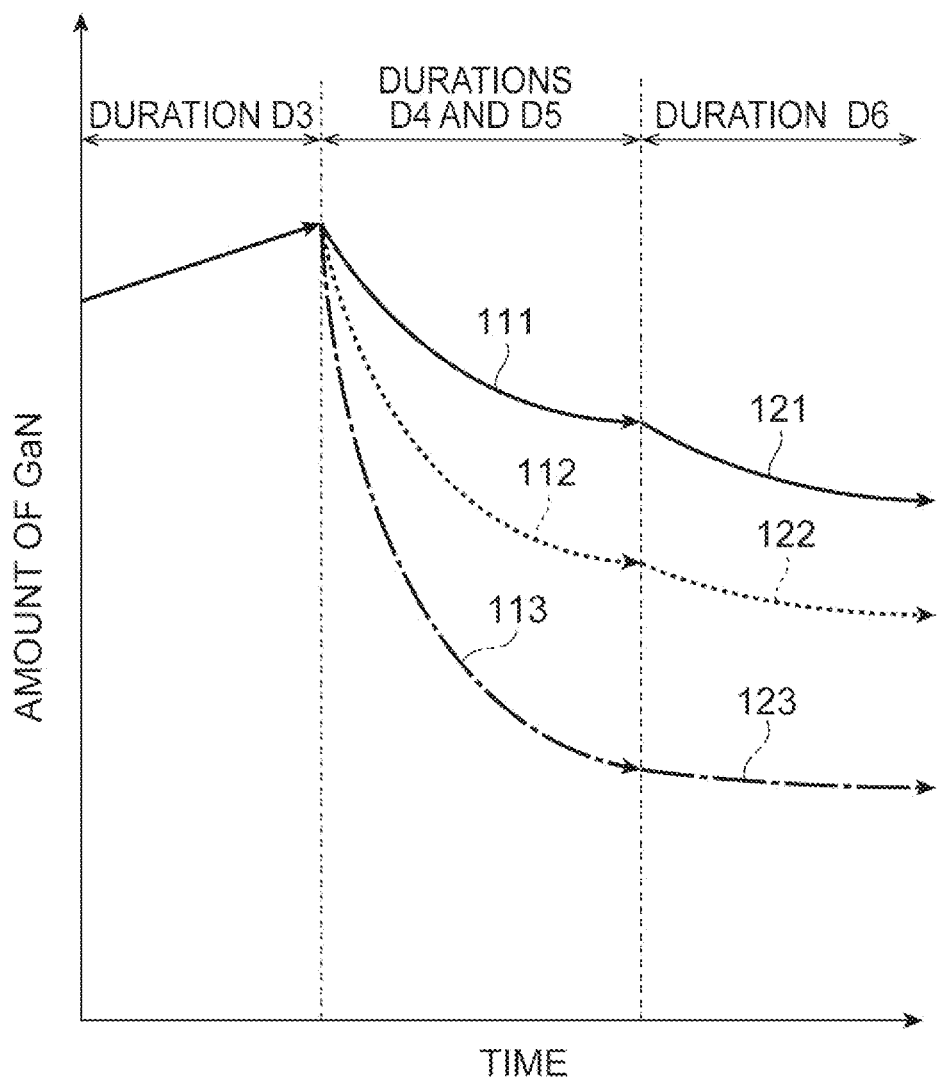
FIG. 14 is a table showing transitions of the amount of GaN deposited on the surface of blowing heads.

FIG. 14 is a table showing transitions of the amount of GaN deposited on the surface of the blowing heads. In FIG. 14, the horizontal axis represents time and the vertical axis represents the amount of GaN deposited on the surface of the blowing heads. In addition, the reference sign 111 represents the transition of the amount of GaN in the deposit from the first embodiment in the durations D4 and D5, the reference sign 112 represents the transition of the amount of GaN in the deposit from the second embodiment in the durations D4 and D5, and the reference sign 113 represents the transition of the amount of GaN in the deposit from the fourth embodiment in the durations D4 and D5. Furthermore, the reference sign 121 represents the transition of the amount of GaN in the deposit from the first embodiment in the duration D6, the reference sign 122 represents the transition of the amount of GaN in the deposit from the second embodiment in the duration D6, and the reference sign 123 represents the transition of the amount of GaN in the deposit from the fourth embodiment in the duration D6. As shown in FIG. 14, in the durations D4 and D5, the amounts of GaN in the deposits from the second embodiment and the fourth embodiment both tend to be lower than that in the first embodiment. From this, it can be seen that adjustment of the space between the blowing heads and the susceptor, and adjustment of the temperature of the blowing heads are effective in removing GaN deposited on the blowing heads.

The method for manufacturing a nitride semiconductor device according to the present disclosure is not limited to the above embodiment or the modified example, but various modifications can be made. For example, the semiconductor substrate in the above embodiment or the modified example may include layers other than the buffer layer, the channel layer, the spacer layer, the barrier layer, and the cap layer. Alternatively, the semiconductor substrate may not include the spacer layer.

The deposit 41 shown in FIG. 6A has a layer shape, but the shape is not limited to this. Deposit attached to the blowing heads may be locally provided. For example, deposit may only be provided at and around the outlets of the ejection holes. Deposit may also be provided on the inner wall of the furnace.

REFERENCE SIGNS LIST

1 Semiconductor substrate
10 Substrate
10a Surface
12 Buffer layer
14 Channel layer
16 Spacer layer
18 Barrier layer
20 Cap layer
30, 30A Semiconductor growth apparatus
31, 31A Furnace (MOCVD furnace)
32 Susceptor (support portion)
32a Recess portion
32b Surface
33, 33A Blowing head (raw material supply portion)
33a Ejection hole
34 Cooling passage
41 Deposit
S, S1 Space
S2 Space (first space)
S3 Space (second space)

The invention claimed is:

1. A method for manufacturing a nitride semiconductor device, comprising:
growing a GaN channel layer on an SiC substrate in a vertical MOCVD furnace set at a first temperature, the vertical MOCVD furnace being supplied with TMG (trimethylgallium) and $NH_3$ as raw materials, and $H_2$ as a carrier gas;
holding the SiC substrate including the grown GaN channel layer in the vertical MOCVD furnace set at a second temperature higher than the first temperature, the vertical MOCVD furnace being supplied with $H_2$ as a carrier gas and $NH_3$; and
growing an InAlN layer on the GaN channel layer in the vertical MOCVD furnace set at a third temperature lower than the first temperature, the vertical MOCVD furnace being supplied with TMI (trimethylindium), TMA (trimethylaluminum), and $NH_3$ as raw materials, and $N_2$ as a carrier gas.

2. The method for manufacturing the nitride semiconductor device according to claim 1,
wherein $H_2$, $NH_3$, and TMI are supplied into the vertical MOCVD furnace in the holding of the SiC substrate.

3. The method for manufacturing the nitride semiconductor device according to claim 1,
wherein the second temperature is between 20° C. and 100° C. higher than the first temperature.

4. The method for manufacturing the nitride semiconductor device according to claim 1, further comprising:
growing an AlN layer on the GaN channel layer in the vertical MOCVD furnace set at a fourth temperature lower than the first temperature after the holding of the SiC substrate and before the growing of the InAlN layer, the vertical MOCVD furnace being supplied with TMA and $NH_3$ as raw materials and $H_2$ or $N_2$ as a carrier gas.

5. The method for manufacturing the nitride semiconductor device according to claim 4,
wherein, in the growing of the AlN layer, the carrier gas is $N_2$ when the fourth temperature is closer to the third temperature than the second temperature, and
wherein, in the growing of the AlN layer, the carrier gas is $H_2$ when the fourth temperature is closer to the second temperature than the third temperature.

6. The method for manufacturing the nitride semiconductor device according to claim 1,
wherein the vertical MOCVD furnace includes a support portion configured to support the SiC substrate, and a raw material supply portion facing the support portion in a thickness direction of the SiC substrate,
wherein, in the holding of the SiC substrate, a first space between the SiC substrate and the raw material supply portion is set, and
wherein, in the growing of the InAlN layer, a second space between the SiC substrate and the raw material supply portion is set wider than the first space.

7. The method for manufacturing the nitride semiconductor device according to claim 6, wherein
the first space in the thickness direction is 2 mm or more and 6 mm or less, and
the second space in the thickness direction is 15 mm or more and 20 mm or less.

8. The method for manufacturing the nitride semiconductor device according to claim 1,
wherein the vertical MOCVD furnace includes a raw material supply portion,
wherein temperature of the raw material supply portion is set to a first apparatus temperature in the holding of the SiC substrate, and
wherein temperature of the raw material supply portion is set to a second apparatus temperature lower than the first apparatus temperature in the growing of the InAlN layer.

9. The method for manufacturing the nitride semiconductor device according to claim 8,
wherein the first apparatus temperature is 60° C. or higher and 90° C. or lower, and
wherein the second apparatus temperature is 20° C. or higher and 30° C. or lower.

10. A method for manufacturing a nitride semiconductor device, comprising:
growing a GaN channel layer on an SiC substrate in a vertical MOCVD furnace set at a first temperature, the vertical MOCVD furnace being supplied with TMG (trimethylgallium) and $NH_3$ as raw materials, and $H_2$ as a carrier gas;
holding the SiC substrate including the grown GaN channel layer at a second temperature of 1000° C. or higher and lower than 1100° C. in the vertical MOCVD furnace, the second temperature being equal to or lower than the first temperature, and the vertical MOCVD furnace being supplied with $H_2$ as a carrier gas, $NH_3$, and TMI (trimethylindium) instead of TMG; and
growing an InAlN layer on the GaN channel layer in the vertical MOCVD furnace set at a third temperature lower than the second temperature, the vertical MOCVD furnace being supplied with TMI, TMA (trimethylaluminum), and $NH_3$ as raw materials, and $N_2$ as a carrier gas.

11. The method for manufacturing the nitride semiconductor device according to claim 10, further comprising:
growing an AlN layer on the GaN channel layer in the vertical MOCVD furnace at a fourth temperature lower than the second temperature and higher than the third temperature after the holding of the SiC substrate and before the growing of the InAlN layer, the vertical MOCVD furnace being supplied with TMA and NH$_3$ as raw materials, and H$_2$ or N$_2$ as a carrier gas.

12. The method for manufacturing the nitride semiconductor device according to claim 11, wherein, in the growing of the AlN layer, the carrier gas is N$_2$ when the fourth temperature is closer to the first temperature than the third temperature, and wherein, in the growing of the AlN layer, the carrier gas is H$_2$ when the fourth temperature is closer to the third temperature than the first temperature.

13. The method for manufacturing the nitride semiconductor device according to claim 10, wherein the vertical MOCVD furnace includes a support portion configured to support the SiC substrate, and a raw material supply portion facing the support portion in a thickness direction of the SiC substrate, wherein, in the holding of the SiC substrate, a first space between the support portion and the raw material supply portion is set, and wherein, in the growing of the InAlN layer, a second space between the support portion and the raw material supply portion is set wider than the first space.

14. The method for manufacturing the nitride semiconductor device according to claim 13, wherein the first space in the thickness direction is 2 mm or more and 6 mm or less, and wherein the second space in the thickness direction is 15 mm or more and 20 mm or less.

15. The method for manufacturing the nitride semiconductor device according to claim 10, wherein the vertical MOCVD furnace includes a raw material supply portion, wherein temperature of the raw material supply portion is set to a first apparatus temperature in the holding of the SiC substrate, and wherein temperature of the raw material supply portion is set to a second apparatus temperature lower than the first apparatus temperature in the growing of the InAlN layer.

16. The method for manufacturing the nitride semiconductor device according to claim 15, wherein the first apparatus temperature is 60° C. or higher and 90° C. or lower, and wherein the second apparatus temperature is 20° C. or higher and 30° C. or lower.

* * * * *